United States Patent [19]

Lewis

[11] Patent Number: 4,513,076

[45] Date of Patent: Apr. 23, 1985

[54] ELECTRON BEAM SENSITIVE RESIST

[75] Inventor: David F. Lewis, Monroe, Conn.

[73] Assignee: GAF Corporation, Wayne, N.J.

[21] Appl. No.: 497,527

[22] Filed: May 24, 1983

[51] Int. Cl.$^3$ .................................................. G03C 1/68
[52] U.S. Cl. ................................. 430/270; 204/159.15; 204/159.16; 430/296; 525/256; 525/259; 525/285
[58] Field of Search ............................... 430/296, 270; 204/159.15, 159.16; 525/256, 259, 285

[56] References Cited

U.S. PATENT DOCUMENTS 3,703,402 11/1972 Cole ................................ 204/159.15
4,375,398 3/1983 Lorenz ................................ 430/296

OTHER PUBLICATIONS

Cole et al., IEEE Transactions on Electron Devices, Jul. 1975, pp. 417–420.

Primary Examiner—Jack P. Brammer
Attorney, Agent, or Firm—J. Gary Mohr; Marilyn J. Maue; Joshua J. Ward

[57] ABSTRACT

This invention describes an improved ionizing radiation sensitive material having high contrast, high sensitivity and comprised of a metal complex of a mixed half-ester or half amide product of the reaction of an N-hydroxy or N-aminoalkyl amide and a hydroxy alkyl terminally unsaturated compound with an alkylvinyl ether-maleic anhydride copolymer. A typical material is made by reacting a metal salt with the mixed half-ester or half-amide product of the reaction of an N-hydroxy or N-amino alkyl amide and a hydroxy alkyl terminally unsaturated compound with an alkyl vinyl ether-maleic anhydride copolymer.

10 Claims, No Drawings

ELECTRON BEAM SENSITIVE RESIST

BACKGROUND OF THE INVENTION

1. Field of the Invention

This invention relates to improved ionizing radiation sensitive materials which are useful as electron beam resists and information recording media.

2. Description of the Prior Art

It is well-known that electron beam irradiation will cause crosslinking of certain polymers. An article by Herbert S. Cole et al entitled "Electron Sensitive Resists Derived from Vinylether—Maleic Anhydride Copolymers" in the IEEE Transactions on Electron Devices, July 1975, p. 417–420 and U.S. Pat. No. 3,703,402 describes a series of such materials made of octadecylvinyl ether and maleic anhydride copolymer half esterified with, among others allyl or propargyl alcohol or hydroxyalkyl acrylate. The authors state that the most efficient radiation induced crosslinking reactions are activated through the presence of an unsaturated terminal group in the resist, and, accordingly, there is a direct association between increased sensitivity and terminal unsaturation. Their experimental results indicated that reduction or elimination of terminal unsaturation caused a drastic decrease in the sensitivity of the resist polymer, and that to require a radiation dose no greater than $5 \times 10^{-7}$ C/cm$^2$ an unsaturated half ester is required and that the unsaturation must be terminal unsaturation.

Contrary to the teaching of Cole, it has also been discovered that in U.S. Pat. No. 4,375,398 that resist compositions equally as sensitive can be obtained with a copolymer that has the terminal unsaturation drastically reduced. It was further found that the contrast of such resists improves appreciably, which feature provides a resolution capability of less than 0.5 micrometer. This increased contrast is achieved with resists made by reacting an alkylvinyl ether-maleic anhydride copolymer with a hydroxyalkyl acrylate such as hydroxyethyl acrylate, hydroxyethyl methacrylate, 3-hydroxypropyl acrylate, 3-hydroxypropylmethacrylate, 4-hydroxybutyl acrylate, 4-hydroxybutyl methacrylate or allyl or propargyl alcohol or pentaerythritol triacrylate and an N-hydroxyalkyl amide or an N-aminoalkyl amide to form the novel half-ester copolymer.

It is therefore the object of this invention to obtain increase in sensitive while not sacrificing the increased contrast that was obtained subsequent to the Cole invention.

SUMMARY OF THE INVENTION

The present invention is concerned with a high sensitivity, high contrast electron beam resist material comprising a metal complex of the mixed half-ester or half amide product of the reaction of an N-hydroxy or N-aminoalkyl amide and a hydroxyalkyl terminally unsaturated copolymer with an alkylvinyl ether-maleic anhydride copolymer. In the preferred form of the invention an N-hydroxyalkyl cyclic amide, such as hydroxyethyl pyrrolidone, and a hydroxyalkyl acrylate, such as hydroxyethyl acrylate, are reacted with a long chain alkylvinyl ether-maleic anhydride copolymer, preferably having about 10-20 carbon atoms in the alkyl chain, such as octadecylvinyl ether-maleic anhydride copolymer and the product of this reaction is further reacted with a metal salt such as basic lead acetate. The hydroxyethyl pyrrolidone and hydroxyethyl acrylate are preferably charged in a 40:60 molar ratio which yields a resist copolymer containing approximately half of the anhydride groups unreacted and approximately half of the anhydride groups reacted to half esters said esterifying groups being in an approximate one to one ratio of hydroxyethyl pyrrolidone to hydroxyethyl acrylate. The product which is soluble in common solvents such as toluene readily forms smooth films on a substrate.

Upon irradiation with an electron beam, the resists of the invention crosslink at a low electron density to form an insoluble polymer (a negative resist) which is adherent to the substrate, is non-tacky and easily handled. The unexposed resist can be washed off readily to form the desired resist pattern.

DETAILED DESCRIPTION OF THE INVENTION

The electron beam sensitive materials of the invention are characterized by the following: (1) high improved sensitivity to electron beam irradiation; (2) insensitivity to visible light or near ultraviolet irradiation; (3) ease of forming smooth films on substrates; (4) resistance of the crosslinked polymer to wet or dry etch; (5) an ability of the material to be washed away readily in the unexposed areas with conventional solvents; (6) formation of a negative resist pattern; (7) superb contrast and resolution capabilities; (8) thermal stability; (9) good shelf life; (10) minimal dark reaction after exposure.

One embodiment of the material of the invention is prepared by esterifying an alkylvinyl ether-maleic anhydride copolymer with a mixture of N-hydroxyalkyl amide and hydroxyalkyl acrylate compounds and reacting this ester product with a metal salt to form the desired mixed half-ester copolymer. Then a thin film of the polymer is applied to a suitable substrate, such as chrome plated glass or quartz mask substrate, silicon wafer or a conductive polyeser substrate, and exposed to a beam of electrons at various charge densities.

The hydroxyalkyl amide component is either an N-hydroxyalkyl cyclic amide, such as hydroxyalkyl pyrrolidone, e.g. hydroxyethyl pyrrolidone, hydroxypropyl pyrrolidone, hydroxybutyl pyrrolidone, hydroxyethyl-γ-caprolactam, hydroxypropyl-γ-caprolactam, hydroxybutyl-γ-caprolactam and the like; or an N-hydroxyalkyl linear amide, such as N-hydroxyethyl acetamide, N-hydroxyethyl propionamide, and the like.

The terminally unsaturated component includes such compounds as allyl or propargyl alcohol and hydroxyalkyl acrylate, e.g. hydroxyethyl acrylate, or methacrylate, 3-hydroxypropyl acrylate or methacrylate, 4-hydroxybutyl acrylate or methacrylate or pentaerythritol triacrylate and the like.

Another embodiment of the material of the invention is prepared by reacting a metal complex of an alkylvinyl ether-maleic anhydride copolymer with a mixture of N-aminoalkyl amide and hydroxy alkyl acrylate compounds to form the desired mixed half-amide/ester copolymer. Then a thin film of the polymer is applied to a suitable substrate, such as chrome plated glass or quartz mask substrate, silicon wafer or a conductive polyester substrate, and exposed to a beam of electrons at various charge densities.

The aminoalkyl amide component is either an N-aminoalkyl cyclic amide, such as aminoalkyl pyrrolidone, e.g. aminoethyl pyrrolidone, aminopropyl pyrrolidone, aminobutyl pyrrolidone, aminoethyl-γ-caprolactam, aminopropyl-γ-caprolactam, aminobutyl- γ-caprolactam and the like; or an N-aminoalkyl linear amide, such as N-aminoethyl acetamide, N-aminoethyl propionamide, and the like.

EXAMPLE 1

Preparation of a lead complex of a mixed half-ester of octadecylvinyl ether-maleic anhydride copolymer 2.5 g., of a mixed half-ester product made by reacting 40 mole % of hydroxyethylpyrrolidone and 60 mole % hydroxyethyl acrylate with an octadecylvinyl ether-maleic anhydride copolymer was dissolved in 50 ml of hot isopropanol. To this soution was added, with stirring, a solution of 0.625 g. of lead acetate dissolved in 47 ml of hot-ethanol. An immediate precipitate forms and precipitation was completed by the addition of 50 ml of ice-cold methanol. The lead complex was filtered, washed with methanol and dried at 60° C. for 1 hour. The product was analyzed and contained 9.9% Pb.

EXAMPLE 2

Preparation of a rhodium complex of a mixed half-ester of octadecylvinyl ether-maleic anhydride copolymer.

3.88 g. of a mixed half-ester product made by reacting 40 mole % of hydroxyethylpyrrolidone and 60 mole % hydroxyethyl acrylate with an octadecylvinylether maleic anhydride copolymer was dissolved in 77.6 ml of hot isopropanol. To this solution was added 1 g. of rhodium trichloride dissolved in 20 ml of ethanol followed by 0.86 g, of stannous chloride dissolved in 20 ml of ethanol. The reactants were stirred at 70° C. for 30 minutes and the rhodium complex precipitated by the addition of 50 ml of cold methanol. The product was washed with methanol and dried at 60° C. for 1 hour.

EXAMPLE 3

Sensitivity of Resists Under Electron Beam Irradiation

Samples were prepared as described in Examples 1 and 2 were dissolved in toluene. They were then spin coated from toluene solution on chromed glass plates and dried. This left a thin film of the copolymer on the chrome. The coated plates were exposed to 15 kV electrons in a suitable device, the dose being varied over the plate through a range of $5 \times 10^{-8}$ to $5 \times 10^{-5}$ C/cm$^2$. Exposure was adjusted to yield a pattern of 64 small squares, each receiving a different dose within this range. After exposure, plates were developed in a 1.1 (w/w) mixture of methylene chloride and isopropyl alcohol and dried. The thickness of the remaining resist was measured with a profilometer. A curve was constructed relating log (dose) to normalized thickness, where normalized thickness in the ratio of actual thickness over original thickness. The dose required for a normalized thickness of 0.5 is defined as sensitivity and the slope of the straight line portion of the curve defines its contrast.

The following metal containing polymers have been tested for electron sensitivity and it has been found that incorporation of the metal ions leads to an increase in sensitivity. This is shown in the following table which sets forth the sensitivity of two metal complexes of a mixed hydroxyethylacrylate-hydroxyethyl-pyrrolidone ester derivative of GANTREZ-AN8194.

| Esterifying Alcohols or Ratio of Mixed Alcohols | No Metal Content Sensitivity (C/cm$^2$ × 10$^6$) | Lead Complex Sensitivity (C/cm$^2$ × 10$^6$) | Rhodium Complex Sensitivity (C/cm$^2$ × 10$^6$) |
|---|---|---|---|
| 20 HEP/30 HEA | 1.175 | 0.35 | 0.30 |

| Esterifying Alcohols or Ratio of Mixed Alcohols | No Metal Content Sensitivity (C/cm$^2$ × 10$^6$) | Calcium Complex Sensitivity (C/cm$^2$ × 10$^6$) | Thallium Complex Sensitivity (C/cm$^2$ × 10$^6$) |
|---|---|---|---|
| 20 HEP/30 HEA | 1.175 | 0.60 | 0.35 |

HEP is hydroxyethyl pyrrolidone
HEA is hydroxyethyl acrylate

The rhodium complex is believed to differ from the lead and calcium salts in that the complexation occurs through olefinic groups rather than carboxylate groups.

While the invention has been described with reference to certain embodiments, it will be understood that changes and modifications may be made which are within the skill of the art. Accordingly, it is intended to be bound only by the appending claims.

What is claimed is:

1. An improved high sensitivity electron beam resist polymer which is a metal complex, wherein the metal is selected from a group consisting of lead, rhodium, calcium or thallium, wherein the lead, calcium or thallium complex is a salt formed by an excess metal ion and carboxyl ion and the rhodium complex is a metal ion and an olifin group in a one to one relationship of the mixed half-ester reaction product of an alkyl vinyl ether-maleic anhydride copolymer with a terminally unsaturated alcohol and an N-hydroxyalkyl amide.

2. A high sensitivity electron beam resist polymer comprising the mixed half-ester product of the reaction of a N-hydroxyalkyl amide and a terminally unsaturated alcohol with a metal complex, wherein the metal is selected from a group consisting of lead, rhodium, calcium or thallium, wherein the lead, calcium or thallium complex is a salt formed by an excess metal ion and a carboxy ion and the rhodium complex is a metal ion and an olifin group in a one to one relationship, of an alkyl vinyl ether-maleic anhydride copolymer.

3. A resist according to claim 1 in which said N-hydroxyalkyl amide is an N-hydroxyalkyl cyclic amide.

4. A resist according to claim 3 in which said amide is an hydroxyalkyl pyrrolidone.

5. A resist according to claim 1 in which said N-hydroxyalkyl amide is an N-hydroalkyl linear amide.

6. A resist according to claim 1 in which said N-hydroxyalkyl amide and terminally unsaturated alcohol compounds are present in a molar ratio of about 40:60 to 60:40 to one another in said polymer.

7. A resist according to claim 1 in which said N-hydroxyalkyl amide and terminally unsaturated alcohol compounds are present in a molar ratio of about 10:90 to 90:10 to one another in said polymer.

8. A resist according to claim 1 in which said N-hydroxyalkyl amide and terminally unsaturated alcohol compounds are present in a molar ratio of about 50:50 to one another in said polymer.

9. A resist according to claim 1 wherein said metal is lead.

10. An information recording material with improved sensitivity to ionizing radiation exposure comprising a copolymer of a metal complex, wherein the metal is selected from a group consisting of lead, rhodium, calcium or thallium, wherein the lead, calcium or thallium complex is a salt formed by an excess metal ion and a carboxy ion and the rhodium complex is a metal ion and an olifin group in a one to one relationship of maleic anhydride and a vinyl monomer, said copolymer being reacted with a mixture of a terminally unsaturated alcohol compound and an N-hydroxyalkyl amide.

* * * * *